（12） United States Patent
Tatemi et al.

(10) Patent No.: US 10,615,590 B2
(45) Date of Patent: Apr. 7, 2020

(54) SWITCH OPERATING CHARACTERISTIC MONITORING DEVICE, SWITCH EQUIPPED WITH SAME, AND SWITCH OPERATING CHARACTERISTIC MONITORING METHOD

(71) Applicant: Hitachi, Ltd., Chiyoda-ku, Tokyo (JP)

(72) Inventors: Masaru Tatemi, Tokyo (JP); Toshiaki Rokunohe, Tokyo (JP); Makoto Hirose, Tokyo (JP); Hideaki Uchiyama, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 425 days.

(21) Appl. No.: 15/674,682

(22) Filed: Aug. 11, 2017

(65) Prior Publication Data

US 2018/0062382 A1  Mar. 1, 2018

(30) Foreign Application Priority Data

Aug. 26, 2016  (JP) ................................. 2016-165279

(51) Int. Cl.
*H02H 7/085* (2006.01)
*H02H 3/04* (2006.01)
(Continued)

(52) U.S. Cl.
CPC ....... *H02H 7/0854* (2013.01); *G01R 31/3274* (2013.01); *H01H 9/0066* (2013.01);
(Continued)

(58) Field of Classification Search
CPC ........ H02H 7/0854; H02H 3/044; H02H 5/00; H02H 3/04; H01H 9/0066; H01H 33/59; G01R 31/3274; G01R 31/343
(Continued)

(56) References Cited

U.S. PATENT DOCUMENTS

2009/0267714 A1* 10/2009 Arioka ..................... H01H 9/54
335/68

FOREIGN PATENT DOCUMENTS

JP  2003-308751 A  10/2003
JP  2008-293682 A  12/2008

OTHER PUBLICATIONS

Kato Tatsuro; Device for monitoring operating characterstic of switch; Publication year: 2003; abstract, specification and Figures (Year: 2003).*

* cited by examiner

*Primary Examiner* — Dharti H Patel
(74) *Attorney, Agent, or Firm* — Crowell & Moring LLP

(57) ABSTRACT

A symptom of malfunction regarding operating characteristics of a switch should be detected exactly. A switch operating characteristic monitoring device is comprised of a current sensor that measures a close command current of a switch, an auxiliary switch that outputs signals from at least two or more auxiliary contacts with reference to positions of a contactor, a measurement unit that measures signals from the current sensor and the auxiliary switch, a diagnosis unit that judges whether or not a malfunction occurs, and a display unit that displays a malfunction when a malfunction has been determined. A threshold is obtained in advance from multiple results of an opening/closing test performed beforehand. A calculation is made for characteristic times which are obtained from the close command current and signals from the auxiliary switch during actual operation of a circuit breaker. If a deviation is found by comparison with a threshold, a malfunction is determined.

15 Claims, 9 Drawing Sheets

(51) Int. Cl.
  *G01R 31/327* (2006.01)
  *H01H 9/00* (2006.01)
  *H02H 5/00* (2006.01)
  *H01H 33/59* (2006.01)
  *G01R 31/34* (2020.01)
(52) U.S. Cl.
  CPC .............. *H02H 3/04* (2013.01); *H02H 3/044* (2013.01); *H02H 5/00* (2013.01); *G01R 31/343* (2013.01); *H01H 33/59* (2013.01)
(58) Field of Classification Search
  USPC .......................................................... 361/63
  See application file for complete search history.

SWITCH OPERATING CHARACTERISTIC MONITORING DEVICE, SWITCH EQUIPPED WITH SAME, AND SWITCH OPERATING CHARACTERISTIC MONITORING METHOD

TECHNICAL FIELD

The present invention relates to a switch operating characteristic monitoring device that is suitable for monitoring a malfunction of a switch to open and close a main circuit, a switch equipped with the same, and a switch operating characteristic monitoring method.

BACKGROUND ART

A gas circuit breaker is installed in an electrical substation or an electrical generating station or the like and it interrupts a current by blowing gas between electrodes which are driven by an actuator in case of a system accident such as an earth fault and a short circuit and works to prevent equipment such as transformers from being damaged. If the gas circuit breaker fails to interrupt a current because it is faulty, the extent of the accident expands and a significant trouble occurs; so, it requires high reliability. A major cause of making a gas circuit breaker faulty is a mechanism system trouble, it is thought that monitoring the operating characteristics of a gas circuit breaker enables it to obviate most of accidents.

In Patent Literature 1 and Patent Literature 2, for monitoring the operating characteristics of a switch to open and close a main circuit of electric power equipment, the following method is taken: when a command is given to monitor the operating characteristics of the switch, a judgment is made as to whether the operating characteristics of the switch are right or wrong by monitoring a period after the command is given until the switch starts to operate and a subsequent period until the operation finishes, based on an excitation current flowing through a closing coil or a tripping coil and detection signals indicating positions of a movable contactor.

PRIOR ART DOCUMENTS

Patent Literature

[Patent Literature 1] Japanese Unexamined Patent Application Publication No. 2008-293682
[Patent Literature 2] Japanese Unexamined Patent Application Publication No. 2003-308751

SUMMARY OF INVENTION

Problem to Be Solved by the Invention

In Patent Literature 1 and Patent Literature 2 mentioned above, however, time data could be obtained, but only for two points of stroke positions with respect to an opening or closing operation from detection signals indicating positions of the movable contactor. Hence, details of operation with respect to opening/closing characteristics could not be taken into consideration and it was impossible to detect a malfunction occurring when the contact began to move and when the contact came near the end of a stroke. In addition, a switch was a device that was used for a long term and a detector used in Patent Literature 1 needed further improvement to reliability for long-term use.

Means for Solving Problem

To solve the foregoing problem, the present invention is characterized in that a switch is provided with at least two or more auxiliary switches which give off signals with reference to a plurality of stroke positions.

Effect of the Invention

According to the present invention, by acquiring detailed information on a movable contactor, it is possible to detect the operating characteristics of a switch at high sensitivity and with high reliability for long-term use.

MODE FOR CARRYING OUT THE INVENTION

In the following, a preferable embodiment for carrying out the present invention will be described with the aid of the drawings. And now, described below is only an exemplary embodiment and it goes without saying that the subject matter of the invention is not limited to the aspect described below.

First Embodiment

Figure 1:
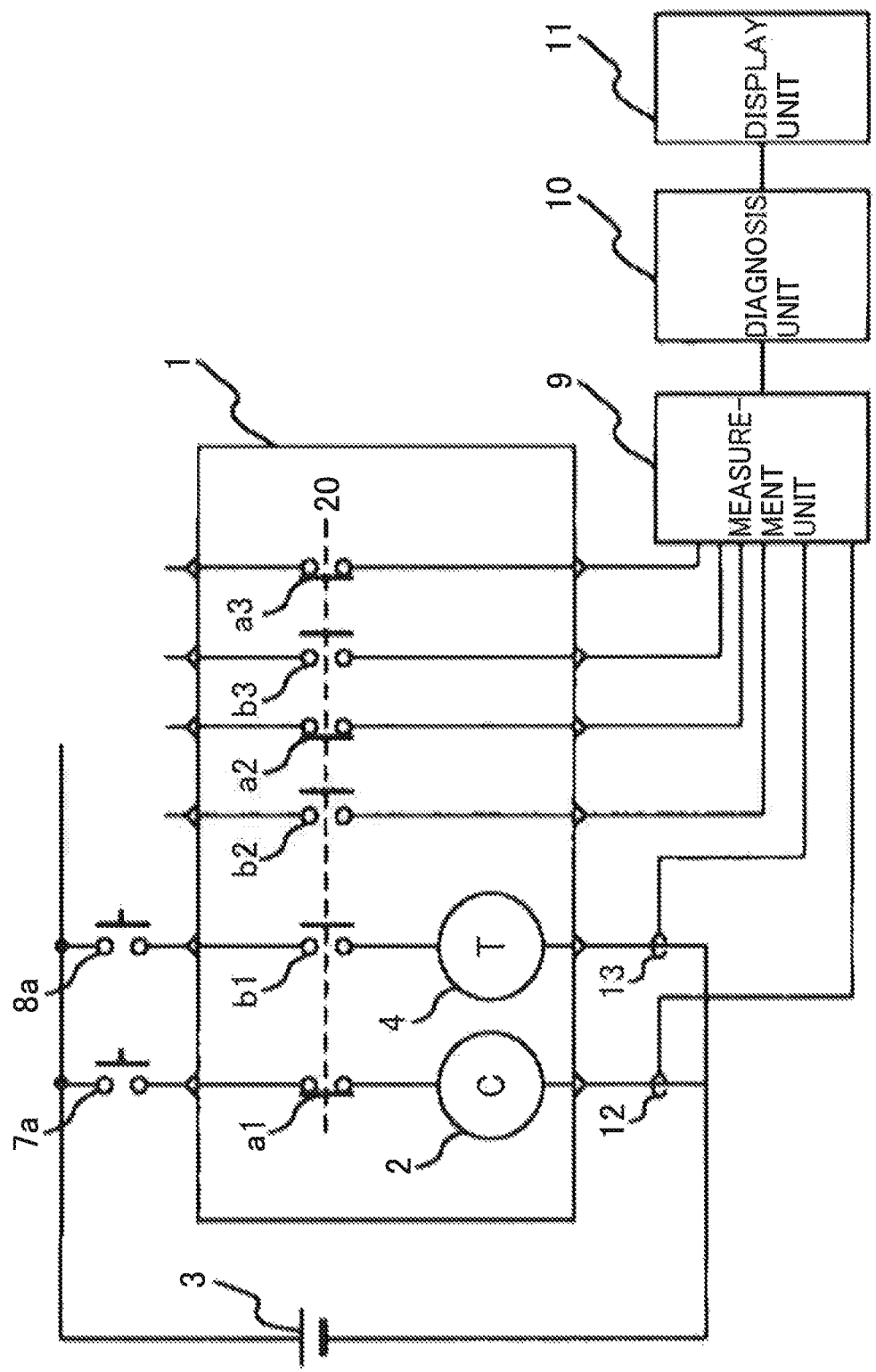
FIG. 1 A block structural diagram of a switch operating characteristic monitoring device which represents a first embodiment.

A first embodiment is described below based on the drawings. FIG. 1 is a block structural diagram of a switch operating characteristic monitoring device. The switch operating characteristic monitoring device is intended for, e.g., a circuit breaker 1 to open and close a three-phase main circuit as a switch and is configured to be capable of detecting whether or not a malfunction occurs when the circuit breaker 1 opens and closes the circuit. The circuit breaker 1 is, for example, a gas circuit breaker (GCB) or a vacuum circuit breaker (VCB). The circuit breaker 1 is configured including a closing coil 2, a tripping coil 4, a measurement unit 9, a diagnosis unit 10, a display unit 11, and an auxiliary switch 20, among others. The auxiliary switch is comprised of, inter alia, auxiliary a-contacts a1, a2, a3 and auxiliary b-contacts b1, b2, b3.

The closing coil 2 is connected in series with both an auxiliary a-contact a1 which is actuated in relation with a main contact of the circuit breaker 1 and a contact 7a to be controlled by a close command and inserted between the supply terminals of a DC power supply 3, and an excitation current flows into this coil when the contact 7a closes in response to a close command from a control device (omitted from depiction). When the current flows into the closing coil 2, the actuator is driven.

Figure 2:
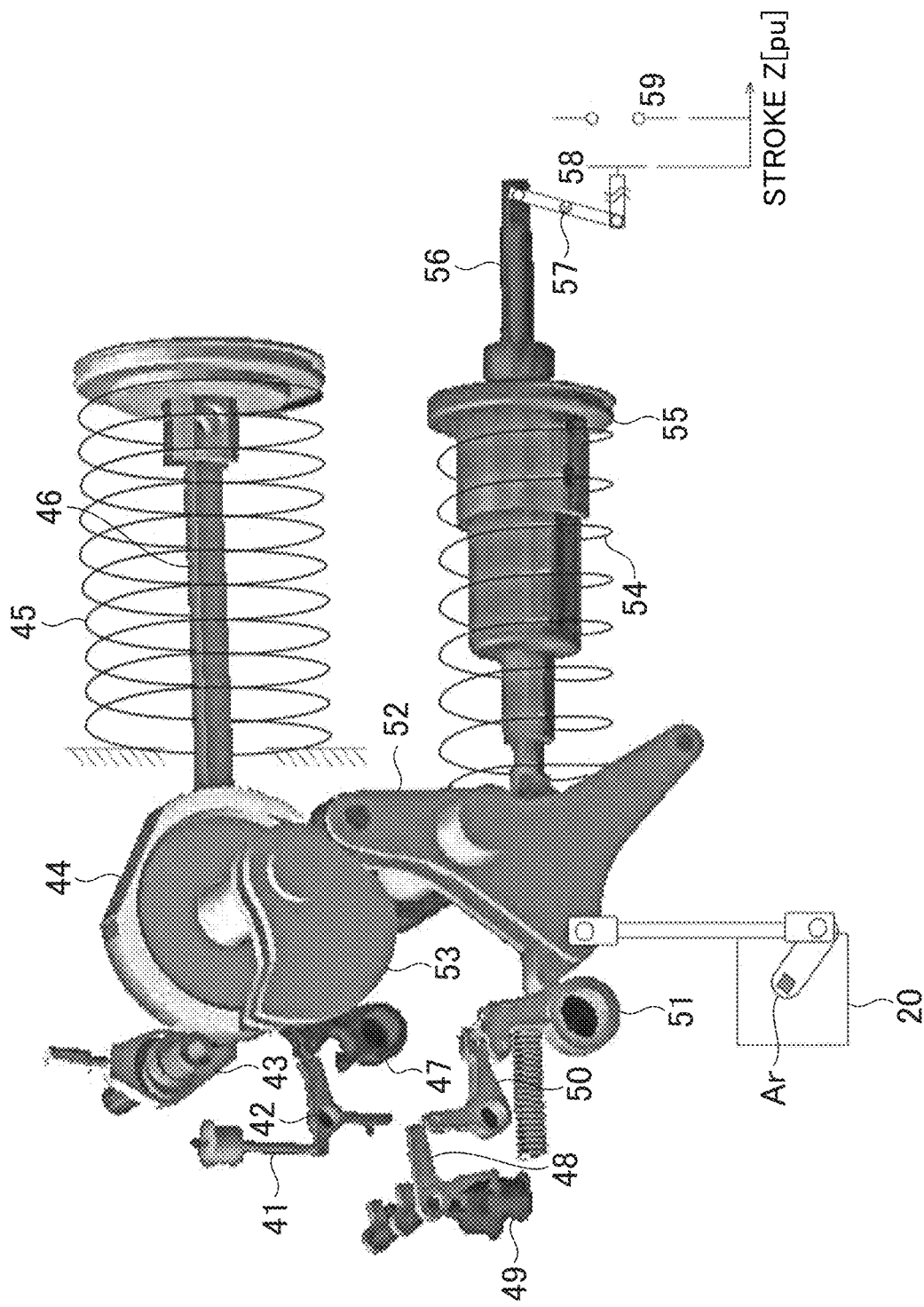
FIG. 2 A diagram depicting a structure of an actuator and its relation with contactors.

FIG. 2 depicts, by way of example, a structure of the actuator and its relation with contactors. A closing spring 45 compressed and biased acts to make a closing spring link 46, a ratchet gear 44 coupled to the link, and a cam 53 fixed coaxially with the ratchet gear turn counterclockwise. This force is borne by a second latch lever 47 for closing and a first latch lever 42 for closing so as to keep a balance of force a force balance.

When the current flows into the closing coil 2, a plunger of a solenoid 41 for closing protrudes to turn the first latch lever 42 for closing counterclockwise, which disengages the first latch lever from the second latch lever 47 for closing. The cam 53 turns counterclockwise by a rotor attached to it along the second latch lever 47 for closing. The turning of the cam 53 turns a main lever 52 clockwise.

The turning of the main lever 52 turns the shaft Ax of the auxiliary switch 20 counterclockwise via a link. At the same time, this turning moves a spring holder which is coupled to the main lever 52 leftward to compress a circuit-breaking spring 54. During the compression, the spring holder engages with a piston 56 and moves the piston 56 leftward. The moving of the piston 56 centers on a shaft 57 and moves a movable contactor 58 rightward. When the movable contactor 58 has come into contact with a stationary contactor 59, closing is achieved.

In FIG. 1, when the main contact of the circuit breaker 1 has been closed, the auxiliary a-contact a1 is opened to place the closing coil 2 in a non-excited state. At this time, an auxiliary b-contact b1 connected in series with the tripping coil 4 closes. The current flowing across the closing coil 2 is detected by a current sensor 12 formed of a shunt resistor and this detection current is supplied to the measurement unit 9.

On the other hand, the tripping coil 4 is connected in series with both the auxiliary b-contact b1 which is actuated in relation with the main contact of the circuit breaker and a contact 8a to be controlled by an open command and connected to the supply terminals of the DC power supply 3, and an excitation current flows into this coil when the contact 8a closes in response to a trip command from the control device, because the auxiliary b-contact b1 is already closed. When the current flows into the tripping coil 4, the actuator is driven and the main contact of the circuit breaker 1 is tripped.

In FIG. 2, by the force of the circuit-breaking spring 54, the movable contactor 58 which is the main contact is disengaged from the stationary contactor. At this time, the main lever 52 turns counterclockwise to turn the shaft Ax of the auxiliary switch clockwise.

After the main contact of the circuit breaker 1 is tripped, the auxiliary b-contact b1 opens and the current flowing across the tripping coil 4 is detected by a current sensor 13 formed of a shunt resistor and this detection current is supplied to the measurement unit 9.

By the excitation of the closing coil 2, the main contact of the circuit breaker 1 is closed and, when a closing operation of the circuit breaker 1 has finished, auxiliary b-contacts b2 and b3 close and a signal indicating that the closing operation has terminated is input to the measurement unit 9. When a tripping operation of the circuit breaker 1 has finished, auxiliary a-contacts a2 and a3 close and a signal indicating that the tripping operation has terminated is input to the measurement unit 9.

Figure 3:
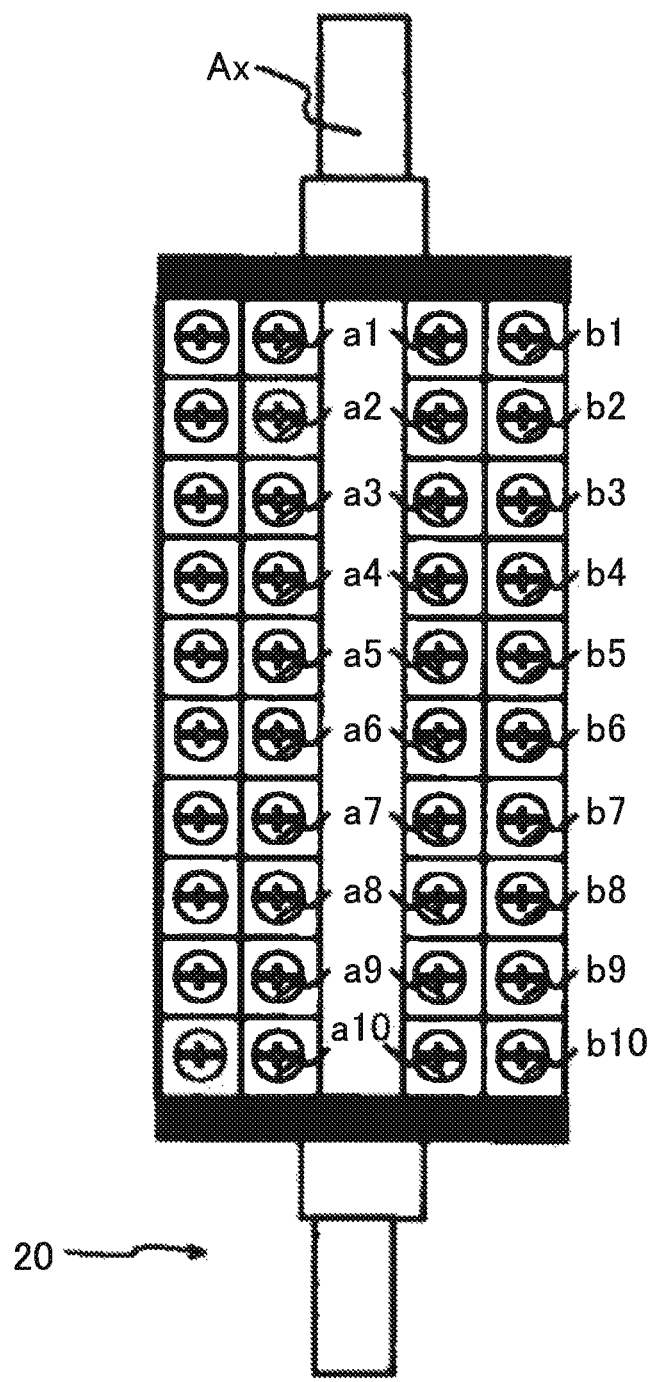
FIG. 3 A top view representing a structure of an auxiliary switch.
Figure 4:
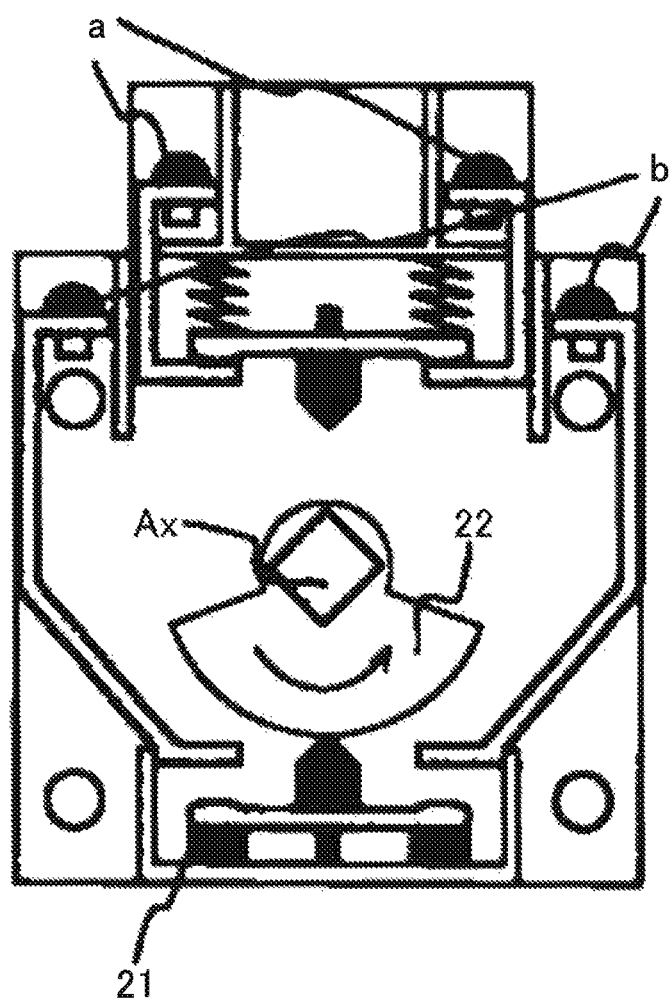
FIG. 4 A side view representing the structure of the auxiliary switch.

A top view representing a structure of the auxiliary switch 20 is depicted in FIG. 3 and its side view is depicted in FIG. 4. The auxiliary switch is such that a sector-form cam 22 is placed on the shaft Ax and, as the shaft Ax turns, lower or upper contacts are displaced by the cam, thereby changing the conductive states of a-contacts a and b-contacts b. In an example depicted, the b-contacts (lower contacts) which were placed ON by the force of a spring 21 are pushed down by the cam to turn OFF and the a-contacts (upper contacts) are placed in ON state by the force of the spring. The contacts of the auxiliary switch 20 are configured such that a plurality of cams on the shaft Ax and contacts are provided and a plurality of sets of a-contacts and b-contacts are obtained. The auxiliary switch 20 is comprised of a plurality of contacts, as depicted in FIG. 3.

Figure 5:
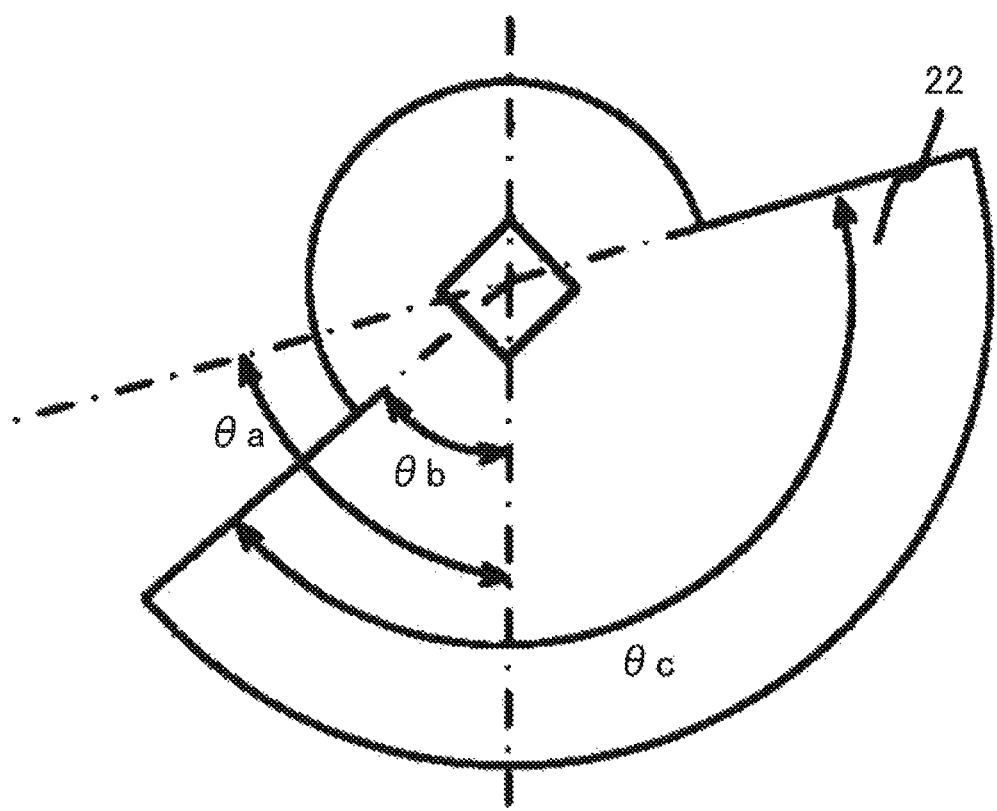
FIG. 5 A diagram depicting a relation among an initial value $\theta a$ of a cam, the cam position $\theta b$ at contact closing, and its sector's central angle $\theta c$.
Figure 6:
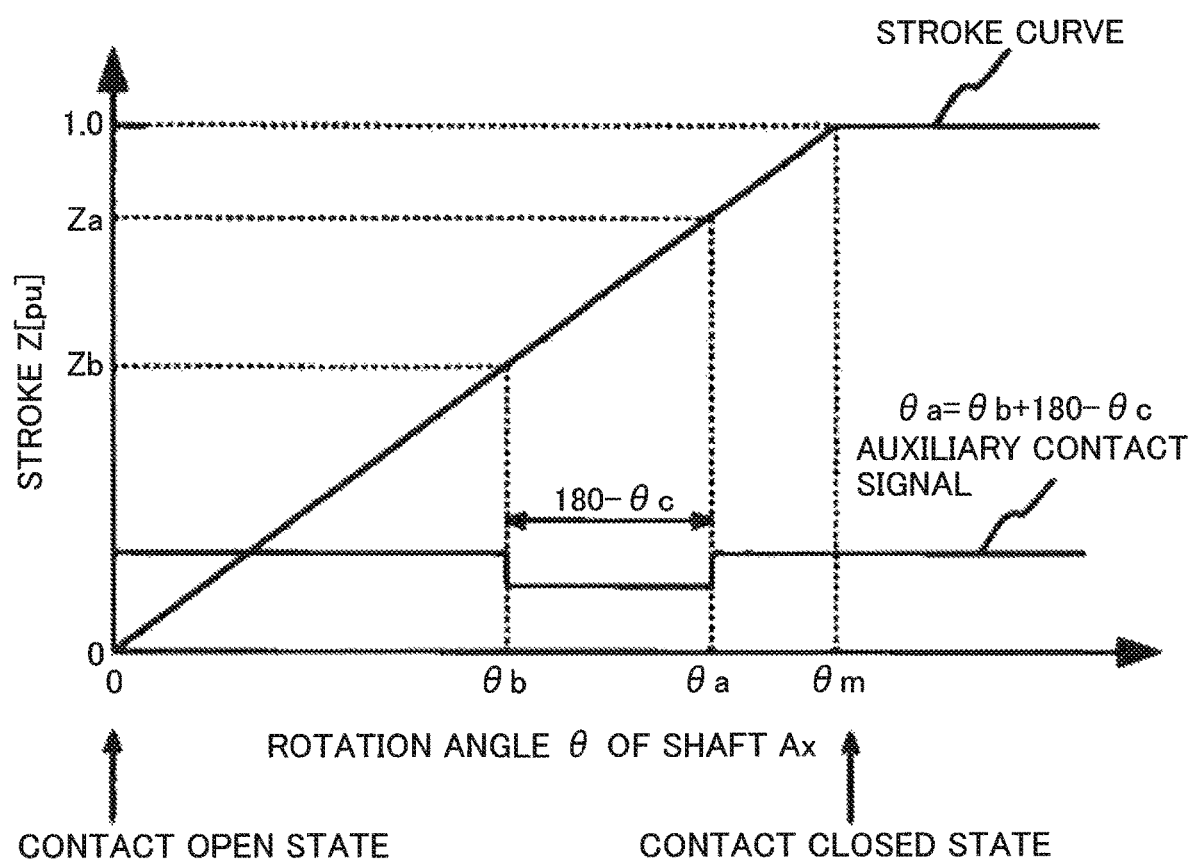
FIG. 6 A diagram representing a relation between the stroke of a movable contactor and the rotation angle $\theta$ of a shaft Ax.

FIG. 5 depicts a relation among an initial value $\theta a$ of the cam of the auxiliary switch 20, the cam position $\theta b$ at contact closing, and its sector's central angle $\theta c$. FIG. 6 represents a relation between the stroke of the movable contactor and the rotation angle $\theta$ of the shaft Ax when in contact closing motion. The abscissa plots the rotation angle of the shaft Ax from the contact open state and the ordinate plots the stroke of the main contact. $\theta=0$ is the contact open state and $\theta m$ is the rotation angle in the contact closed state. It is indicated that a b-contact turns ON (with resistance being 0) at $\theta b$ and an a-contact turns OFF at $\theta a$. Desired $\theta a$ and $\theta b$ can be realized by making the cam 22 such that its position at contact closing will be at $\theta b$ and the central angle of the cam 22 will be $\theta c$ $(=\theta b-\theta b+180)$. $Z=0$ indicates the position of the movable contactor in the contact open state and $Z=1$ indicates its position in the contact closed state. There is one-to-one relation between the stroke and the rotation angle $\theta$ of the shaft Ax and the stroke position can be cognized by knowing the rotation angle $\theta$.

Figure 7:
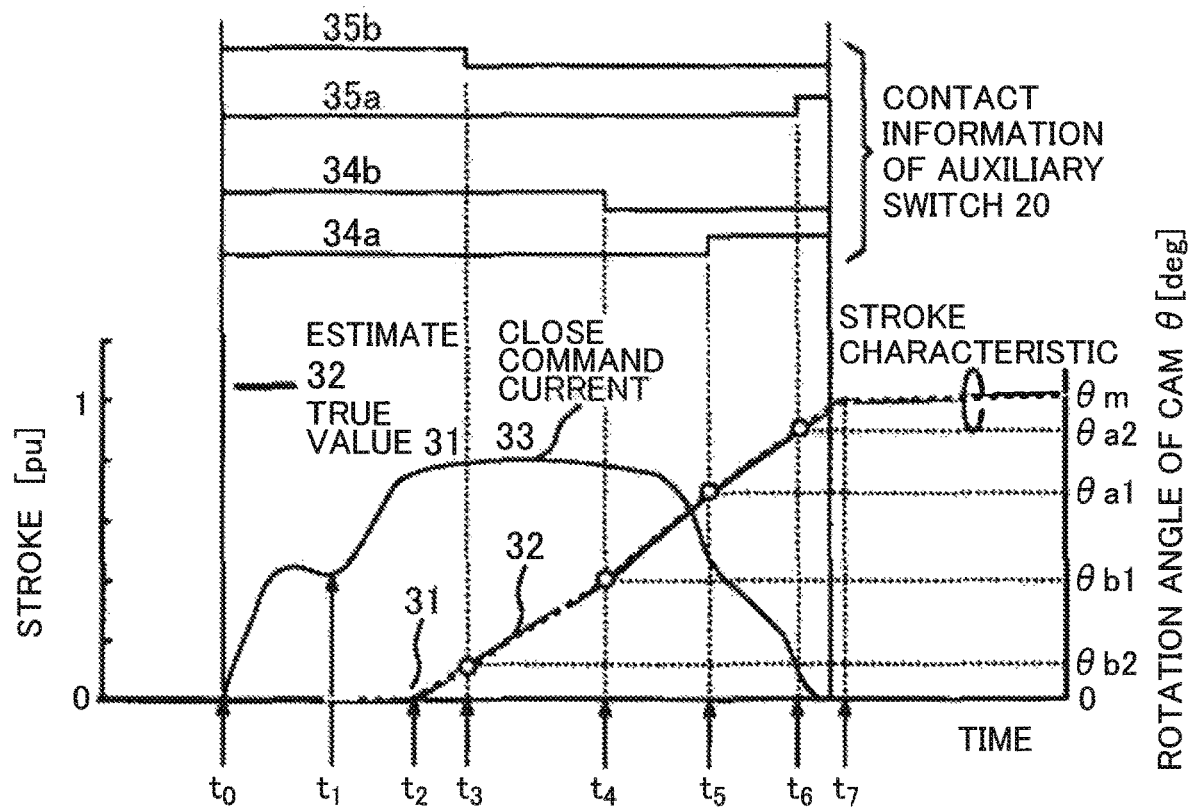
FIG. 7 A diagram representing how to estimate a stroke characteristic.

FIG. 7 represents contact information 35a, 35b, 34a, 34b from the auxiliary switch 20, a close command current 33, a true value 31 of stroke characteristic, and an estimate value 32 of stroke characteristic. When the circuit breaker 1 is closed properly, the close command current 33 and the true value 31 of the stroke characteristic of the movable contactor 58 are represented by a generally regular waveform and there is no significant variation whenever the closing is done. Hence, to judge whether or not there is a malfunction in the operating characteristics of the circuit breaker 1, it is important that the true value 31 of the stroke characteristic of the movable contactor 58 can be simulated exactly. To obtain the true value 31 of the stroke characteristic, it is conceivable to use, inter alia, a potentiometer or a laser displacement meter; but it is difficult to install such meter in the circuit breaker 1. Additionally, there is a problem in which such meter cannot be used for long-term use while keeping sufficient reliability.

Accordingly, in the first embodiment, based on the above relation between the stroke and the rotation angle of the shaft Ax in the auxiliary switch 20, variants of the initial position $\theta b$ and the central angle $\theta c$ of the cam 22 are incorporated in the auxiliary switch 20, so that signal data of the auxiliary switch for at least two points with respect to one stroke can be obtained. In FIG. 7, by obtaining contact signals for four points from the auxiliary switch 20, it is enabled to estimate the stroke characteristic at high accuracy. The auxiliary switch 20 thus arranged to serve as a measuring instrument which is more convenient becomes capable of being used for long-term use while keeping sufficient reliability.

34a, 34b, 35a, 35b, 33 in FIG. 7 respectively correspond to signals at a2, b2, a3, b3, 12 in FIG. 1 taken in by the measurement unit 9 during a closing operation. In this example, two auxiliary contacts are used to simulate the stroke characteristics and, therefore, four signals in total are taken in. When the abscissa plots time starting from when the close command current rises and the ordinate plots the stroke starting from the position of the movable contactor in the contact open state, plots marked with white circles are obtained from signal level change points for each contact at t3, t4, t5, t6 and corresponding cam angles θb2, θb1, θa1, θa2 and an estimate value 32 of stroke characteristic can be approximated with a line graph. When time at of a line connecting the plotted points at t3 and t4 meets a zero stroke level is taken as t2 and time at which an extension of a line connecting the plotted points at t5 and t6 meets a 1-pu stroke level is taken as t7, t2 indicates the time when the movable contactor begins to move and t7 indicates the time when the movable contactor has come to stop position. If the number of auxiliary contacts that are used is increased, more approximation to the true value 31 of the actual stroke characteristic is obtained and it is possible to estimate the stroke characteristic more exactly.

Figure 8:
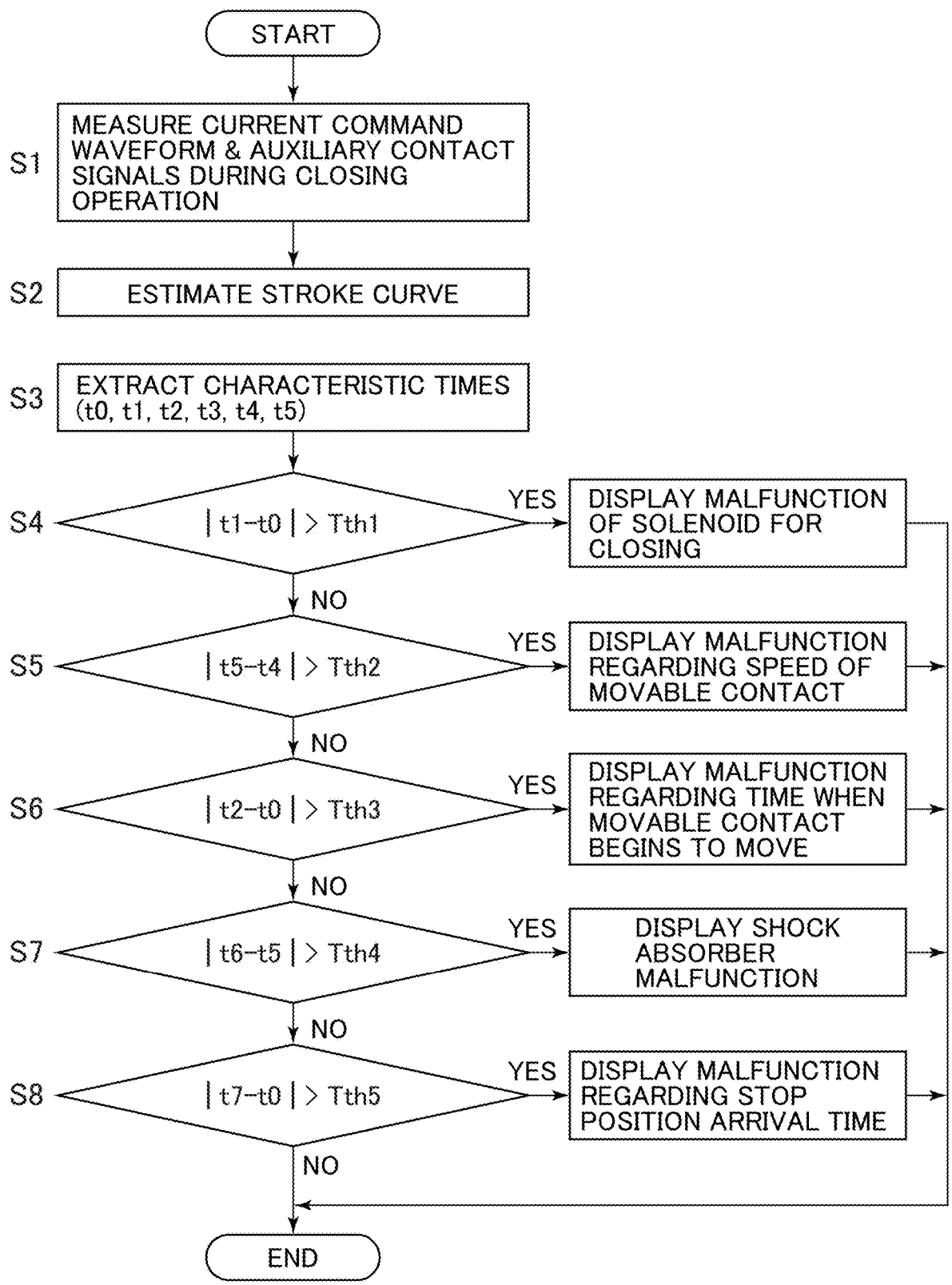
FIG. 8 A diagnosis flow diagram of the first embodiment.

FIG. 8 illustrates a diagnosis flow diagram of the first embodiment. When a command to close the circuit breaker 1 has been input, the measurement unit 9 measures a close command signal 33 flowing across the closing coil 2 and currents 34a, 34b, 35a, 35b corresponding to auxiliary switch signals a2, b2, a3, b3 (S1).

Stroke characteristic values are estimated from a relation between the auxiliary switch signals and the cam rotation angles of auxiliary contacts related to a stroke cognized beforehand (S2).

As represented in FIG. 7, as characteristic times, a current rise time t0 and a minimum value t1, when the close command current slightly falls, are extracted from the close command current 33 and times t3, t4, t5, t6 when the signals in the auxiliary switch change in level are extracted from the auxiliary switch signals. Also, by linear approximation, time t2 when the movable contactor begins to move is estimated from the plotted points at t3 and t4 and time t7 when the movable contactor comes to stop position is estimated from the plotted points at t5 and t6. And now, the slight fall of the close command current occurs when the plunger of the solenoid for closing pushes the first latch lever 42 (S3).

When a difference between times t1 and t0 is larger than a threshold Tth1, it is judged that the solenoid for closing is not smooth and a malfunction is displayed on the display unit 11 (S4).

As seen from FIG. 7, the stroke characteristic around the center (0.5 pu) of its characteristic curve can generally be approximated linearly. Therefore, a difference between times t4 and t5 relates to the speed of the movable contactor. When the difference between times t4 and t5 is larger than a threshold Tth2, it is judged that a malfunction regarding the moving speed of the movable contactor occurs and the malfunction is displayed on the display unit 11 (S5).

When a difference between times t2 and t0 is larger than a threshold Tth3, the following is inferable: subsequently to the motion of the plunger of the solenoid 41 for closing, the motion of the first latch lever 42 for closing or the second latch lever 47 for closing is problematic. A malfunction regarding the time when the movable contactor beings to move is displayed (S6).

Near to time t6, the stroke will almost terminate soon and the moving part decelerates along with the movable contactor by the action of a shock absorber. When a difference between times t6 and t5 is larger than a threshold Tth4, it is inferable that a malfunction occurs in the shock absorber and, therefore, the malfunction is displayed (S7).

When a difference between times t7 and t0 is larger than a threshold Tth5, it is judged that there is a malfunction regarding time until the movable contactor comes to stop position and the malfunction regarding stop position arrival time is displayed (S8).

Then, descriptions are provided about how to determine the thresholds (from Tth1 to Tth5) used in the right side of an inequality in the blocks for malfunction judgment described above.

The thresholds can be determined by actuating the circuit breaker numerous times beforehand, extracting the characteristic times t0 to t7 in normal operation, and evaluating a variation in these times. When the circuit breaker's motion is proper, values representing a time difference in the right side in the blocks for malfunction judgment are nearly unchanged and constant, but vary slightly.

Figure 9:
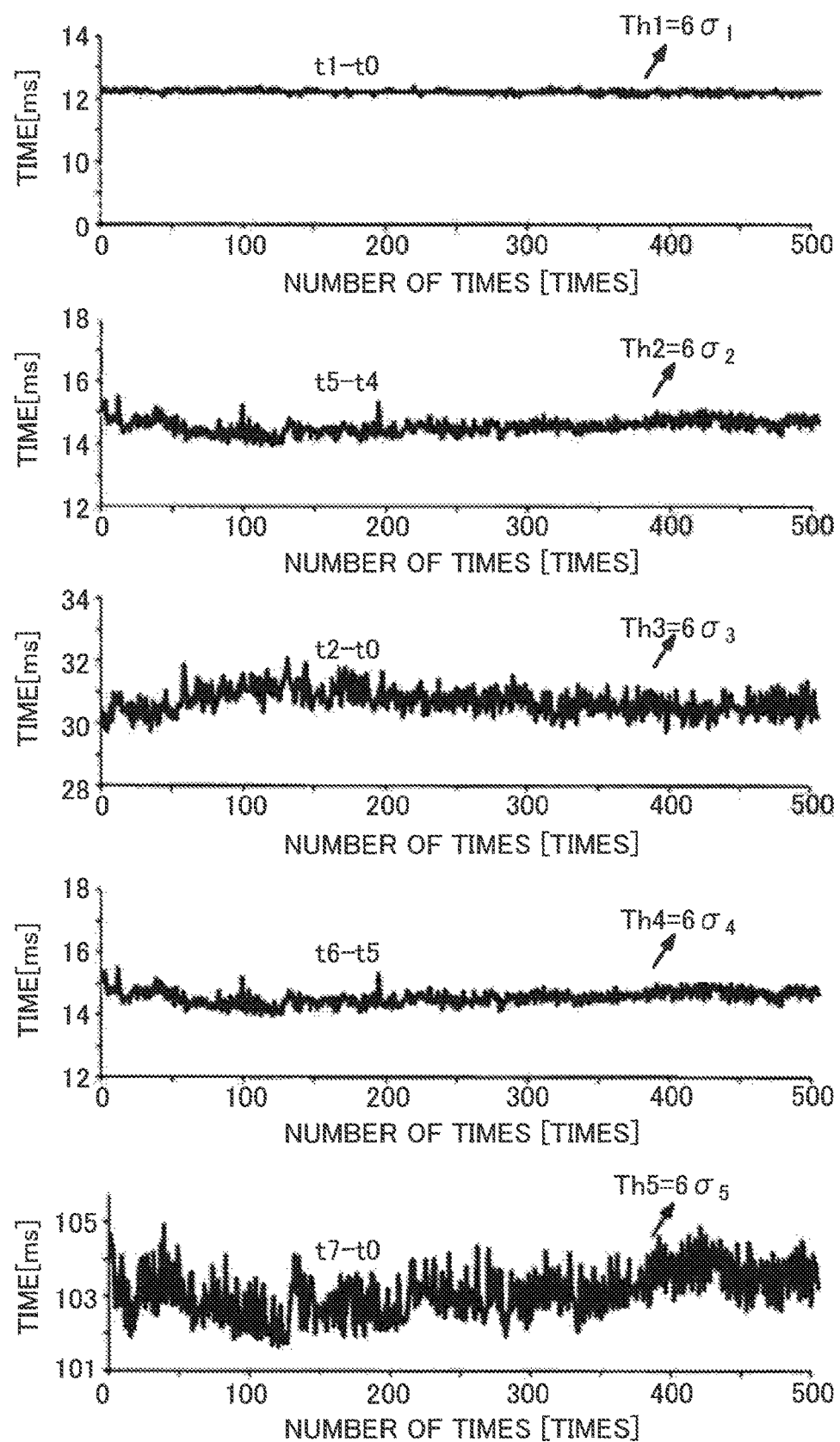
FIG. 9 Data representing a variation in each time difference when the circuit breaker was actuated about 500 times.

FIG. 9 represents a variation in each time difference when the circuit breaker 1 was actuated about 500 times. As an example, a threshold Tth1 in this case is obtained by calculating an average value tlav over 500 obtained values by Equation 1, then calculating a standard deviation σ1 by Equation 2, and, finally, setting the average value and the standard deviation multiplied by n as the threshold Tth1 by Equation 3. Thresholds Tth2 to Tth5 can also be calculated in the same way of thinking. A threshold can be obtained by thus calculating a standard deviation σ of the data and adding the standard deviation multiplied by n to the average value.

$$\text{tlav} = [\Sigma[i=1, 500](t1(i) - t0(i))]/500 \qquad \text{[Equation 1]}$$

$$\sigma1 = \sqrt{[(\Sigma[i=1, 500]((t1(i) - t0(i)) - \text{tlav})^2)/(n-1)]} \qquad \text{[Equation 2]}$$

$$Th1 = n\sigma1 + \text{tlav} \qquad \text{[Equation 3]}$$

According to the first embodiment, by provision of at least two or more auxiliary switches which give off signals with reference to a plurality of stroke positions, it is possible to obtain opening/closing characteristics when the contact begins to move and when the contact comes near the end of a stroke and detect a malfunction at high sensitivity over a long term.

The present invention is not limited to the described embodiment and various modifications are included therein. For example, the foregoing embodiment is described in detail to explain the present invention clearly and the embodiment is not necessarily limited to one including all components described. A subset of the components of an embodiment can be replaced by components of another embodiment. To the components of an embodiment, components of another embodiment can be added. For a subset of the components of each embodiment, other components can be added to the subset or the subset can be removed or replaced by other components.

EXPLANATIONS OF LETTERS AND NUMERALS

1: Circuit breaker
2: Closing coil
3: DC power supply
4: Tripping coil
9: Measurement unit
10: Diagnosis unit
11: Display unit 12, 13: Current sensor
20: Auxiliary switch
21: Spring
22, 53: Cam
31: True value of stroke characteristic
32: Estimate value of stroke characteristic
33: Close command current
41: Solenoid for closing
42: First latch lever for closing
44: Ratchet gear
45: Closing spring
46: Link
47: Second latch lever for closing
52: Main lever
54: Circuit-breaking spring
56: Piston
58: Movable contactor
59: Stationary contactor
a: a-contact
b: b-contact
a1, a2, a3: Auxiliary a-contact
b1, b2, b3: Auxiliary b-contact
7a, 8a: Contact

The invention claimed is:

1. A switch operating characteristic monitoring device comprising:
   a current sensor that measures a close command current of a switch;
   an auxiliary switch that outputs signals from at least two or more auxiliary contacts with reference to positions of a contactor;
   a measurement unit that measures signals from the current sensor and the auxiliary switch;
   a diagnosis unit that judges whether or not a malfunction occurs from the signals obtained by the measurement unit; and
   a display unit that displays a malfunction when a malfunction has been determined from a result of diagnosis by the diagnosis unit.

2. The switch operating characteristic monitoring device according to claim 1,
   wherein the each auxiliary switch is provided with at least two points of contact switching timing with reference to positions of the contactor.

3. The switch operating characteristic monitoring device according to claim 2,
   wherein the diagnosis unit calculates characteristic times from the close command current and the signals from the auxiliary switch.

4. The switch operating characteristic monitoring device according to claim 3,
   wherein the diagnosis unit sets, from measured signals, time t0 when the close command signal rises, time t1 when a first minimum value of the close command signal appears, time t2 when the contactor begins to move, times t4, t5, t6 when signals at the auxiliary contacts of the auxiliary switch change in level in order of earliness, and time t7 when the motion of the contactor terminates, makes comparison with a threshold, displays a malfunction of a solenoid for closing if |t1−t0| is larger than a predetermined threshold, displays a movable contactor malfunction if |t5−t4| is larger than a predetermined threshold, displays a malfunction regarding motion start time if |t2−t0| is larger than a predetermined threshold, displays a shock absorber malfunction if |t6−t5| is larger than a predetermined threshold, and displays a malfunction regarding motion end time if |t7−t0| is larger than a predetermined threshold.

5. The switch operating characteristic monitoring device according to claim 4,
   wherein the diagnosis unit stores a threshold determined from an average value and a standard deviation from an opening/closing characteristic test performed beforehand.

6. A switch equipped with the switch operating characteristic monitoring device described in claim 1.

7. A switch equipped with the switch operating characteristic monitoring device described in claim 2.

8. A switch equipped with the switch operating characteristic monitoring device described in claim 3.

9. A switch equipped with the switch operating characteristic monitoring device described in claim 4.

10. A switch equipped with the switch operating characteristic monitoring device described in claim 5.

11. A switch operating characteristic monitoring method comprising:
    acquiring a close command current of a switch;
    acquiring signals from at least two or more auxiliary contacts of an auxiliary switch with reference to positions of a contactor;
    measuring the close command signal and the signals;
    judging whether or not a malfunction occurs from the measured signals; and
    displaying a malfunction if a malfunction occurs.

12. The switch operating characteristic monitoring method according to claim 11, comprising acquiring signals provided with at least two points of contact switching timing with reference to positions of the contactor from the auxiliary switch.

13. The switch operating characteristic monitoring method according to claim 12, comprising by extracting, from the measured signals, time t0 when the close command signal rises, time t1 when a first minimum value of the close command signal appears, time t2 when the contactor begins to move, times t4, t5, t6 when signals at auxiliary contacts change in level in order or earliness, and time t7 when the motion of the contactor terminates, making comparison with a threshold, displaying a malfunction of a solenoid for closing if |t1−t0| is larger than a predetermined threshold, displaying a movable contactor malfunction if |t5−t4| is larger than a predetermined threshold, displaying a malfunction regarding motion start time if |t2−t0| is larger than a predetermined threshold, displaying a shock absorber malfunction if |t6−t5| is larger than a predetermined threshold, and displaying a malfunction regarding motion end time if |t7−t0| is larger than a predetermined threshold.

14. The switch operating characteristic monitoring method according to claim 13,
    wherein the threshold is obtained from an average value and a standard deviation from an opening/closing characteristic test performed multiple times beforehand.

15. The switch operating characteristic monitoring method according to claim 14,
    wherein the threshold is obtained from:

$$t1av = [\Sigma[i=1, 500](t1(i) - t0(i))]/500 \qquad [\text{Equation 1}]$$

$$\sigma1 = \sqrt{[(\Sigma[i=1, 500]((t1(i) - t0(i)) - t1av)^2)/(n-1)]} \qquad [\text{Equation 2}]$$

$$Th1 = n\sigma1 + t1av \qquad [\text{Equation 3}]$$

* * * * *